(12) United States Patent
Huang et al.

(10) Patent No.: US 8,432,685 B2
(45) Date of Patent: Apr. 30, 2013

(54) CASING FOR SHELTERING ELECTRONIC COMPONENTS AND NETWORK ELEMENT AND AIR PASSAGE

(75) Inventors: Zi Liang Huang, Beijing (CN); Zhu Yong, Beijing (CN)

(73) Assignee: Nokia Siemens Networks Oy, Espoo (FI)

( * ) Notice: Subject to any disclaimer, the term of this patent is extended or adjusted under 35 U.S.C. 154(b) by 212 days.

(21) Appl. No.: 13/057,852

(22) PCT Filed: Aug. 7, 2009

(86) PCT No.: PCT/EP2009/060272
§ 371 (c)(1),
(2), (4) Date: Apr. 1, 2011

(87) PCT Pub. No.: WO2010/015702
PCT Pub. Date: Feb. 11, 2010

(65) Prior Publication Data
US 2011/0182036 A1 Jul. 28, 2011

(30) Foreign Application Priority Data

Aug. 7, 2008 (EP) .................................. 08104985

(51) Int. Cl.
*H05K 5/00* (2006.01)

(52) U.S. Cl.
USPC ...... 361/679.46; 361/688; 361/724; 454/184; 165/104.33

(58) Field of Classification Search .............. 361/679.46
See application file for complete search history.

(56) References Cited

U.S. PATENT DOCUMENTS

| | | | |
|---|---|---|---|
| 6,643,130 B1 | 11/2003 | DeMarchis et al. | |
| 7,031,154 B2 * | 4/2006 | Bash et al. | 361/690 |
| 7,068,507 B2 * | 6/2006 | Pfeifer et al. | 361/699 |
| 8,009,430 B2 * | 8/2011 | Claassen et al. | 361/724 |
| 2004/0007348 A1 | 1/2004 | Stoller | |
| 2004/0218355 A1 * | 11/2004 | Bash et al. | 361/690 |
| 2006/0012947 A1 | 1/2006 | Nakata et al. | |
| 2006/0172685 A1 * | 8/2006 | O'Brien | 454/184 |
| 2008/0068798 A1 * | 3/2008 | Hendrix et al. | 361/696 |

FOREIGN PATENT DOCUMENTS

EP 1536674 A1 6/2005

* cited by examiner

*Primary Examiner* — Anthony Q Edwards
(74) *Attorney, Agent, or Firm* — Laurence A. Greenberg; Werner H. Stemer; Ralph E. Locher

(57) ABSTRACT

A casing for sheltering electronic components (52, 83) is disclosed, comprising:—an air inlet (110) at a first position of the casing (11) and,—an air outlet at a second position of the casing (11). The air inlet (110) comprises a first plate (112) with at least one first aperture (190) therein. The inlet (110) also comprises a second plate (114) that is arranged between the first plate (112) and an inner part of the casing (11). The second plate comprises at least one second aperture (192).

11 Claims, 4 Drawing Sheets

CASING FOR SHELTERING ELECTRONIC COMPONENTS AND NETWORK ELEMENT AND AIR PASSAGE

BACKGROUND OF THE INVENTION

Field of the Invention

The present invention relates generally to a casing/shelter for sheltering electronic components, to a network element and to an air passage. The casing comprises an air inlet at a first position of the casing and an air outlet at a second position of the casing. The second position is usually different from the first position.

The air inlet may comprise a first plate with at least one first aperture, typically with a plurality of first apertures. The apertures allow air to flow in the casing for cooling purposes. The cooling may be active using a fan or passive using only convection.

The casing may also comprise a filter element that is arranged near the air inlet and prevents for instance dust particles from entering into the casing. The filtering element may comprise synthetic fibers, for instance glass fibers or polypropylene fibers.

Especially, casings for the sheltering of network elements and other telecommunication equipment have to fulfill special demands with regard to, for instance:
 fire resistance,
 earthquake resistance,
 protection against rain water or sprinkling water, and
 protection against undesired touching.

Furthermore, there may be other demands that result from standards or de facto standards, for instance from:
 ATCA (Advanced Telecommunications Computing Architecture) that was developed by the PCI industrial computers manufacturers group (PICMG), and/or
 NEBS (Network Equipment-Building system) that was developed by Regional Bell Operating Companies (RBOC).

BRIEF SUMMARY OF THE INVENTION

Therefore, there is a need for a casing that fulfills as much as possible of the demands that were mentioned above, especially the demands for touching protection and/or preventing particles from outside coming in and/or against sprinkling water. Furthermore there is a need for a corresponding network element and/or air passage.

This need is accomplished by the subject matter of the independent claims. The sub claims refer to specific embodiments of the present invention.

The casing may comprise in addition to the parts which were mentioned at the beginning:
 a first plate comprising at least one first aperture therein, and
 a second plate arranged between the first plate and an inner part of the casing and the second plate comprising at least one second aperture.

Typically, there may be a plurality of second apertures. The first position may be for instance in a front door of the casing or in a front side of the casing. The second position may be for instance in an upper part of the casing. Alternatively the first position and the second position may be at other places, for instance at side walls of the casing.

By using only two plates it is possible to have a simple construction which is able to fulfill demands with regard to touching protection and/or sprinkling water protection.

The first plate may be arranged in parallel to the second plate. If those plates are arranged in parallel only a little space is needed. A distance between the two plates is for instance smaller than 25 mm (Millimeter) but greater than for instance 5 mm.

The first plate may comprise at least a first slat which extends to the outside of the casing thereby forming a part of the border of a first aperture. In addition, the second plate may comprise a least one second slat. The second slat extends also towards the outside of the casing. If there are a plurality of first slats and a plurality of second slats each plate resembles a Venetian blind in that it is provided with a plurality of elongated slats arranged in parallel, spaced relation and also in columns. Such an arrangement gives excellent protection against water, dust particles or even intrusion of mechanical parts from the outside of the casing to the inside of the casing.

The first slat may extend from the first plate downwardly, especially at least with a portion of the first slat that extends to the outside of the casing. Furthermore, the second slat may extend from the second plate upwardly, especially at least with a portion thereof that extends towards the outside of the casing. By directing the slats to different direction, it is possible to prevent in a simple manner the intrusion of long mechanical devices, for instance of a screwdriver or of a long wire.

The terms "downwardly" and "upwardly" refer to the usual operation position of the casing or of the network element. The slats of the first plate may have the same shape as the slats of the second plate. However, the second plate may be arranged top down compared to the first plate.

The first slat and the first plate may include a first acute angle pointing in a first direction. The second slat and the second plate may include a second acute angle pointing in a second direction which is opposite to the first direction. The angle may include a range of 15 degrees to 45 degrees. The angle may be well defined if the slats are flat or planar. However, it is also possible to define an angle if the slat are non-planar, for instance if they are bent in the vertical direction. This will be explained in more detail below with reference to FIG. 4.

The first plate and the second plate may be made of aluminum or consist of aluminum or an aluminum alloy containing at least 90 atom percent aluminum. Aluminum is preferred because it has comparably low specific weight, for instance compared to steel. However, it is also possible to use other materials than aluminum, for instance steel, copper etc.

The casing may comprise a filter element which is arranged between the second plate and an inner part of the casing. This effects, that the protection that is created by the arrangement of the two plates extends also to the filter element, i.e. it is not possible to damage the filter element using a thin wire or a screwdriver, for instance.

It may be not possible to insert a wire with a diameter of 2.5 mm or below or alternatively of 1 mm or below through the air inlet 110 using an inserting force of 1 Newton or below, for instance. The diameter of the wired is for instance greater than 0.5 mm. By fulfilling these demands it is possible to conform with international protection classes, for instance according to EN (European Norm) 60 529, class IP4. or IP5. or higher. The "." in the name of the IP class is a space holder for a second digit that relates to a different kind of protection demands.

The casing may comprise a mechanical frame having the shape of a parallelepiped, i.e. there are six surfaces, wherein each surface may have a rectangular shape. The square is understood here as a special case of a rectangular shape.

Furthermore, the surfaces of all three pairs of opposite surfaces are parallel to each other, respectively.

There may also be a network element which comprises a casing according to the invention or its embodiments. Furthermore, the network element comprises electronic components of a switch, a router or of a telecommunication device. The switch performs forwarding of data packets at a level two according to the ISO (International Organization for Standardization) network protocol stack, for instance using MAC (Medium Access Control) addresses. A router performs forwarding of data packets at level three of the stack, for instance according to the internet protocol (IP). The telecommunication device may perform circuit switching or packet switching. The telecommunication device may comprise units for xDSL (x Digital Subscriber Lines), especially for ADSL (Asymmetrical DSL) or other DSL standards.

There may also be an air passage, i.e. an air inlet or an air outlet, that comprises the features of the embodiments mentioned above.

The foregoing has outlined rather broadly the features and technical advantages of embodiments of the present invention in order that the detailed description of the invention that follows may be better understood. Additional features and advantages of the embodiments of the invention will be described hereinafter. It should be appreciated by those skilled in the art that the conception and the specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

For a more complete understanding of the present invention and the advantages thereof, reference is now made to the following description taken in conjunction with the accompanying drawings, in which:

DESCRIPTION OF THE INVENTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Moreover, the same reference signs refer to the same technical features if not stated otherwise. As far as "may" is used in this application it means the possibility of doing so as well as the actual technical implementation.

The present invention will be described with respect to preferred embodiments in a specific context namely a telecommunication cabinet. The invention may also be applied, however, to other technical devices, for instance transformers for high voltages of greater 200 volts or even greater 1000 volts.

Figure 1:
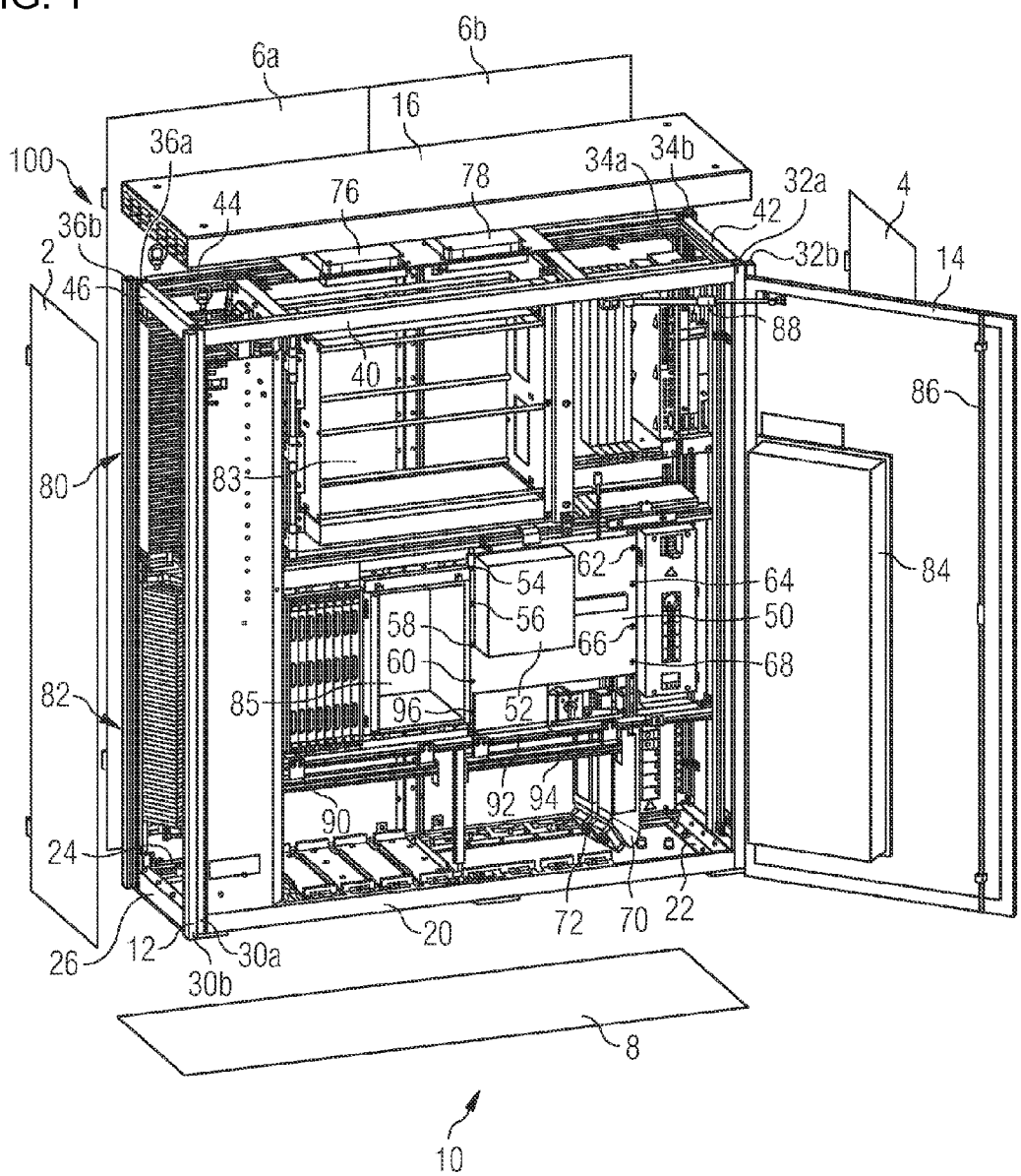
FIG. 1 illustrates a perspective view of a telecommunication cabinet.

FIG. 1 illustrates a perspective view of a telecommunication cabinet 10. The cabinet 10 includes a frame 12, two doors (only right hand side door 14 is shown), a top cover 16 and covers for side walls and for the back wall that will be explained in more detail below.

The frame 12 comprises:
a front bottom rail 20,
a right bottom rail 22,
a back bottom rail 24,
a left bottom rail 26,
left front rails 30a, 30b; alternatively only one rail may be used instead of rails 30a, 30b,
right front rails 32a, 32b,
right back rails 34a, 34b,
left back rails 36a, 36b,
front top rail 40,
right top rail 42,
back top rail 44, and
left top rail 46.

This means that the frame 12 has the shape of the edges of a parallelepiped. There is a casing 11 that comprises:
a left side panel 2,
a right side panel 4,
a back panel or back panels 6a, 6b,
front doors, only the right front door 14 is shown, and
a bottom panel 8.

The panels 2, 4, 6a and 6b are fastened by hinges but may be also fastened by other fastening means, for instance by screws. Panel 8 as well as top cover 16 may be fastened by screws or by other fastening means.

The cabinet 10 includes for instance a support plate 50 for an electronic device, for instance, for a rectifier. The support plate 50 is fastened to the frame 12 by screws 54 to 68.

FIG. 1 also shows ventilation channels 70, 72 in the lower part of cabinet 10. Electrical fans 76, 78 may be arranged in the upper part of the cabinet 10. An air flow may be directed through slots in the front door 14 and through a channel 84 which contains a filter element to the fans 76, 78 and then through air outlets 100 in side walls of top cover 16. Air outlet 100 may be formed similarly or identically to air inlet 110. Other arrangements of the air inlets and the air outlets are also possible, for instance in side walls of cabinet 10.

Other electronic devices 82 may be arranged in slots 80 that are situated on the left side of the cabinet 10.

Digital logic units (DLU) 83 may also be inserted in cabinet 10. These DLU's are connected or may be connected to subscriber lines that lead to DSL (Digital Subscriber Line) subscribers which use for instance ADSL (Asymmetrical Digital Subscriber Line) or other kinds of xDSL. Therefore, a unit 83 is also named an electronic splitter.

Other telecommunication equipment 85 may be arranged left from plate 50, for instance DSLAMs (DSL Access Multiplexer) HiX 5630 or HiX 5635 DSLAMs manufactured by Nokia Siemens Networks may be used.

FIG. 1 also shows a locking mechanism 86 for locking door 14. Furthermore, a telescope arm 88 is shown which is connected to frame 12 and to door 14.

FIG. 1 also shows mounting rails 90, 92 that are arranged above compartments for batteries. Both mounting rails 90, 92 are fastened on a horizontal rail 94 by means of holding elements. Vertical rails 96 and 98 are arranged at the left side and at the right side of the support plate 50.

Figure 2:
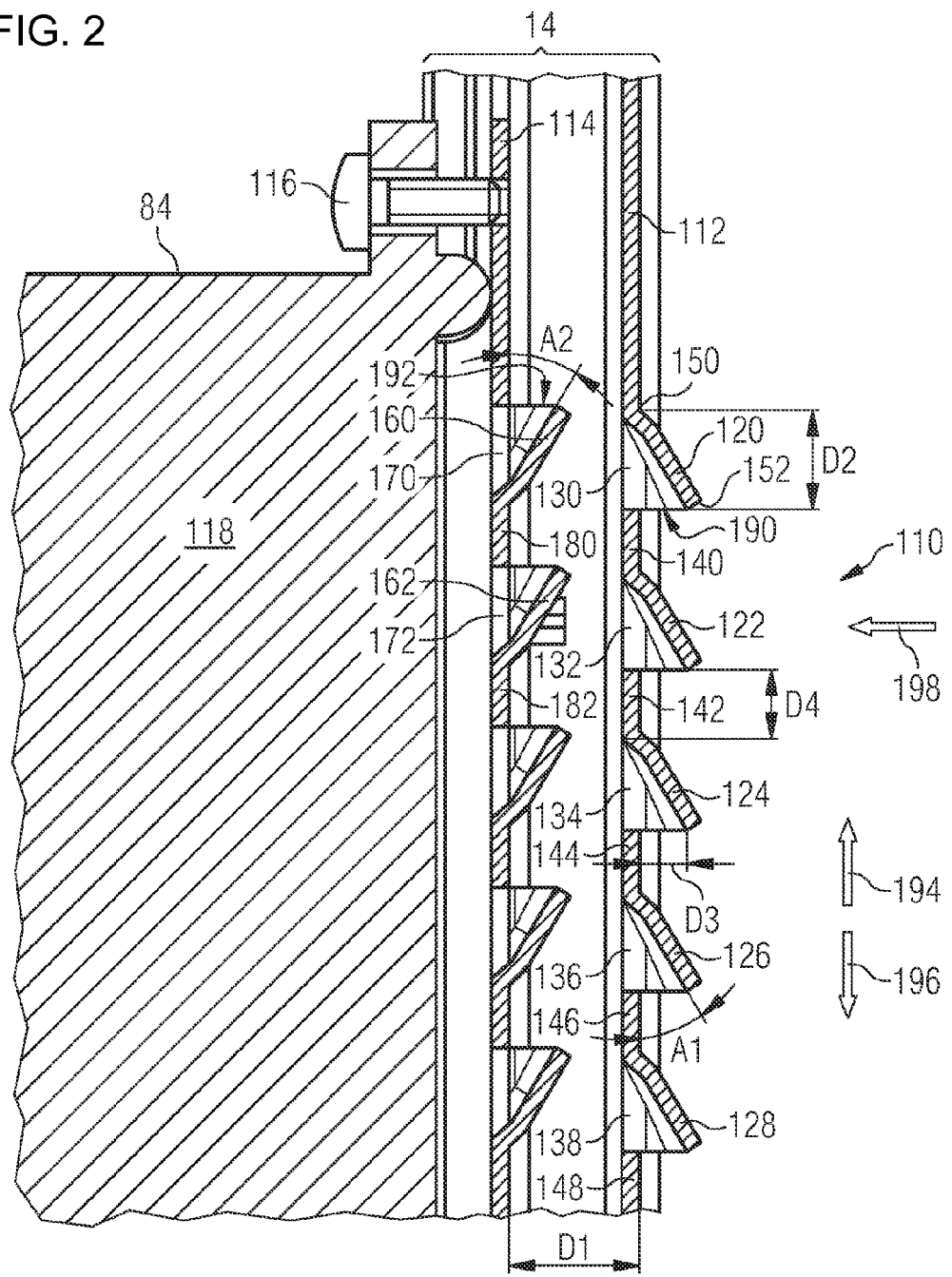
FIG. 2 illustrates a first embodiment of an air inlet of the cabinet.

FIG. 2 illustrates a first embodiment of an air inlet 110 of cabinet 10. Air inlet 110 is part of the right front door 14 of cabinet 10. Air inlet 110 comprises of the following parts, arranged in parallel with regard to each other:
- an outside panel 112 or plate,
- an inside panel 114 or plate, and
- a filter element 118 that is held by the channel 84.

Channel 84 forms a frame that circumferences filter element 118 and is fastened to the inside panel 114 by a fastening element, for instance by a screw 116.

Outside panel 112 comprises the following parts:
- slats 120 to 128 or lamellas,
- slits 130 to 138, and
- horizontal ribs 140 to 148.

FIG. 2 shows only five slats 120 to 128 although there are typically much more than these five slats. Slats 120 to 128 extend from outside panel 112 to the outside of casing 11. FIG. 2 shows a cross section in the vertical direction. In this cross section the slats 120 to 128 have straight section lines with the cross section. The slats 120 to 128 each have an essentially rectangular shape or contour, especially in the main portion thereof. There is a horizontal bending only at end portions of the slats 120 to 128. It is possible to punch the slats 120 to 128 out from the panel 112 thereby creating the slits 130 to 138 and the ribs 140 to 148.

In the embodiment shown in FIG. 2 the slats 120 to 128 are wider compared to the height of slits 130 to 138. This can be reached by an appropriate punching. For instance, slat 120 has an upper edge that corresponds to a bending edge 150 that extends in a horizontal direction. Slat 120 also has a lower edge 152 that extends parallel to bending edge 150. The lower edge 152 is a free edge of slat 120. The width of slat 120 equals the distance between edge 150 and edge 152.

According to FIG. 2 the slats 120 to 128 extend from panel 112 downwardly, see arrow 196. Therefore, rain water or sprinkling water will drop downwardly to the ground but not inside the casing 11. Furthermore slats 120 to 128 prevent dust from falling into casing 11.

FIG. 2 shows the following distances:
- a distance D1 between inside panel 114 and outside panel 112, for instance in the range of 7 mm to 20 mm or of 10 mm to 13 mm,
- a distance D2 that corresponds to the height of the slits 130 to 138, for instance in the range of 2 mm to 15 mm or of 3 mm to 10 mm,
- a distance D3 between the outside panel 112 and the lower edge of slats 120 to 128, for instance in the range of 1 mm to 10 mm or of 2 mm to 6 mm, and
- a distance D4 which corresponds to the height of horizontal ribs 140 to 148 preferably in the range of 2 mm to 20 mm or of 5 mm to 10 mm.

The horizontal ribs 140 to 148 are as flat as outside panel 112. The slits 130 to 138 and the horizontal ribs 140 to 148 have rectangular contours in the present embodiment.

The part of inside panel 114 that is part of air inlet 110 has the same shape compared to the part of outside panel 112 that is part of air inlet 110. However the part of inside panel 114 is turned top down compared with the corresponding part of outside panel 112. Therefore, there are the following parts of inside panel 114:
- slats 160, 162,
- slits 170, 172, and
- horizontal ribs 180, 182.

FIG. 2 only shows five slats of inside panel 114 from which only two have reference signs 160 and 162. Usually, there are is a plurality of slats 160, 162 in inside panel 114. The slats 160, 162 of inside panel 114 extend from inside panel 114 upwardly towards the outside of casing 11, i.e. towards outside panel 112. There is an angle A2 between slat 160 or 162 and inside panel 140 which is an acute angle, for instance in the range of 15 degrees to 45 degrees. Angle A2 has preferably the same value as angle A1 between slats 120 to 128 and outside panel 112, for instance in the range from 10 degrees to 50 degrees.

As the slats 120 to 128 are directed downwardly and as the slats 160, 162 are directed upwardly it is almost impossible to insert a wire or a screwdriver in air inlet 110.

In the embodiment shown in FIG. 2 slits 130 to 138 of outside panel 112 are aligned with corresponding slits 170, 172 of inside panel 114 in a direction that is normal to outside panel 112 or to inside panel 114, see arrow 198.

In a modification of the embodiment shown in FIG. 2 slats 120 to 128 and slats 160, 162 each have two free edges 150, 152. In this case ribs 140 to 146 and 180, 182 are optional.

Other arrangements and shapes of slats 120 to 128 and 160, 162 are possible as well.

Figure 3:
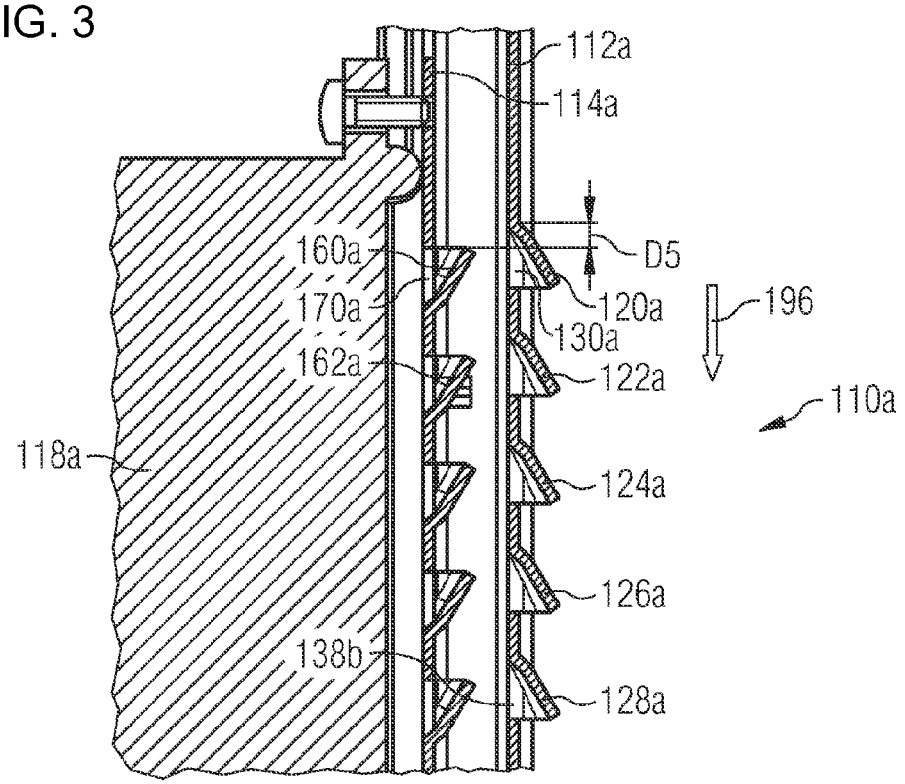
FIG. 3 illustrates a second embodiment of an air inlet.

FIG. 3 illustrates a second embodiment of air inlet 110. Same parts are referenced by the same reference signs without detailed explanation of these parts to avoid repetition. However the parts of FIG. 3 have an appended letter "a". This means that there are for instance the following parts of air inlet 110a:
- an outside panel 112a,
- an inside panel 114a,
- slats 120a to 128a of outside panel 112a,
- slats 160a, 162a of inside panel 114a, and
- slit 138b that corresponds to slit 138.

The difference between FIG. 3 and FIG. 2 is, that there is an offset D5 between the higher edges of slits 130a and 170a, i.e. neighboring slits 120a of outside panel 112a and 170a of inside panel 114a are not aligned with each other. The distance D5 is preferably in the range of 1 mm to 10 mm or of 2 mm to 7 mm.

Figure 4:
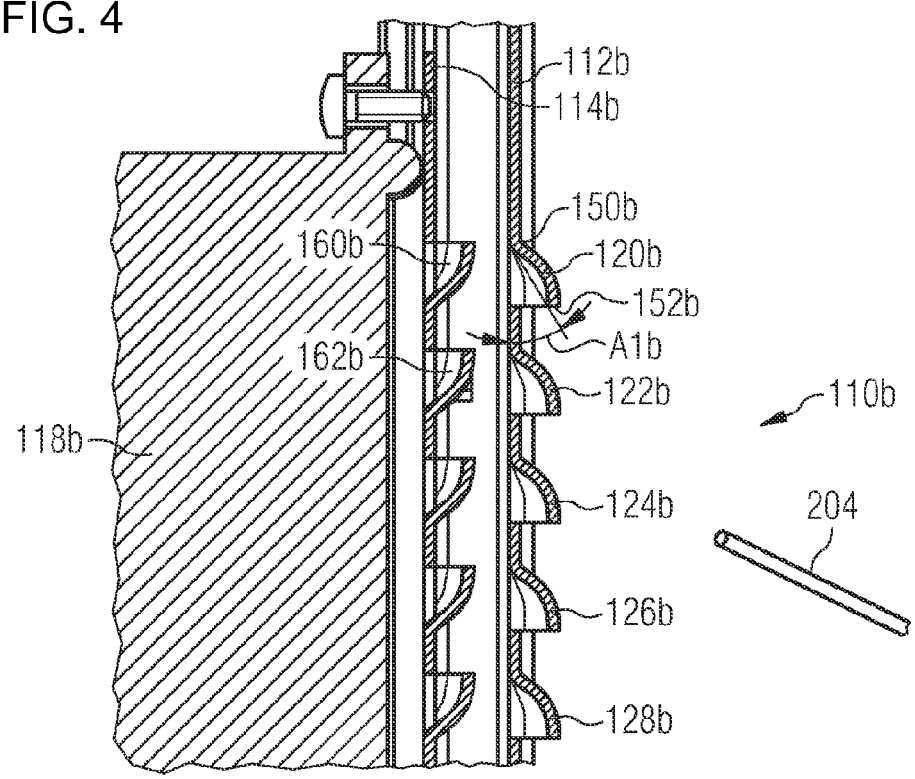
FIG. 4 illustrates a third embodiment of an air inlet.

FIG. 4 illustrates a third embodiment, i.e. an air inlet 110b. Corresponding parts are again referenced by the same reference numbers. However, the letter "b" is appended to the reference signs of FIG. 4. Therefore, there are for instance the following parts of air inlet 110b:
- an outside panel 112b that corresponds to outside panel 112
- an inside panel 114b that corresponds to inside panel 114,
- slats 120b to 128b that are similar to slats 120 to 128 with regard to the direction in which the slats 120b to 128b extend from outside panel 112,
- slats 160b and 162b that correspond to slats 160 and 162 with regard to the direction in which they extend from inside panel 114b.

Figure 5:
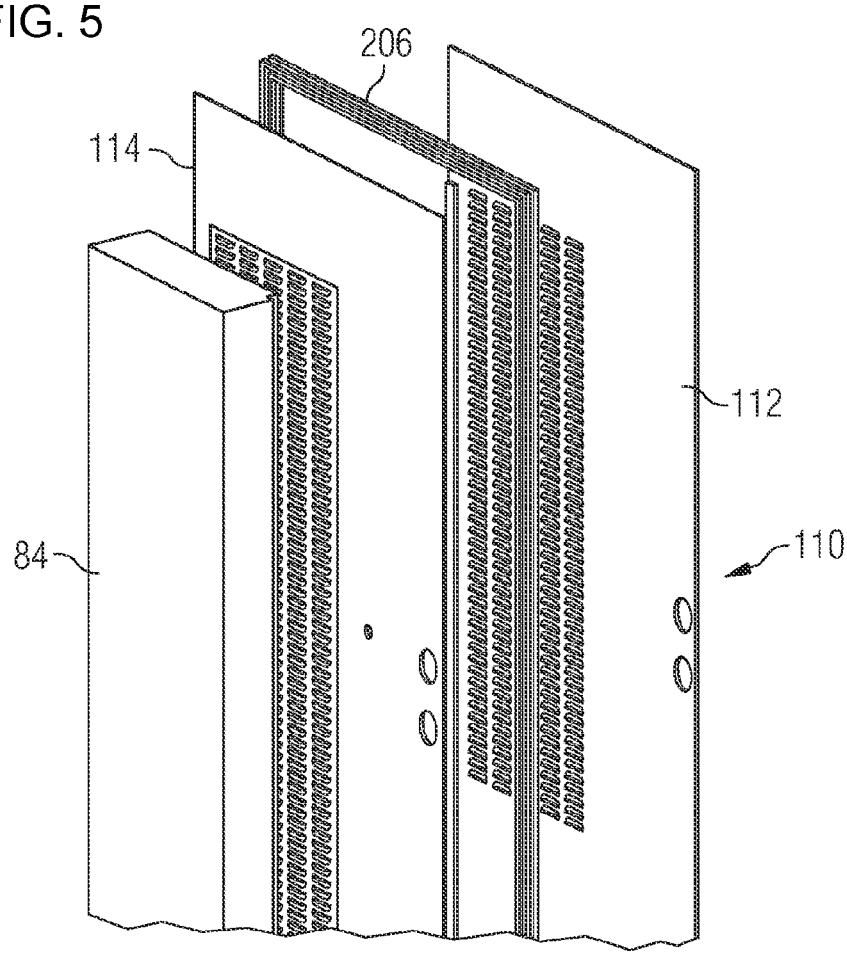
FIG. 5 illustrates an exploded view of an air inlet mechanical shelter.

However, slats 120b to 128b and 160b and 162b are non-planar in their main lateral portions. As shown in FIG. 4 slats 120b to 128b and 160b and 162b are bent in the plane in which the cross section in FIG. 5 is arranged. There may be a circular bending, a non-circular bending or an aspheric bending. Other kinds of bending are possible as well.

FIG. 4 also shows a wire 204 that has a diameter of 1 mm or smaller. It is almost impossible to insert the wire 206 into inlet 110b.

An angle A1b is defined between outside panel 112 and slat 120b. The right side of the angle A1b is adjacent to a bending edge 150b of slat 120b and to the free edge 152b of slat 120b. Angle A1b may have the same range as angle A1.

Figure 6:
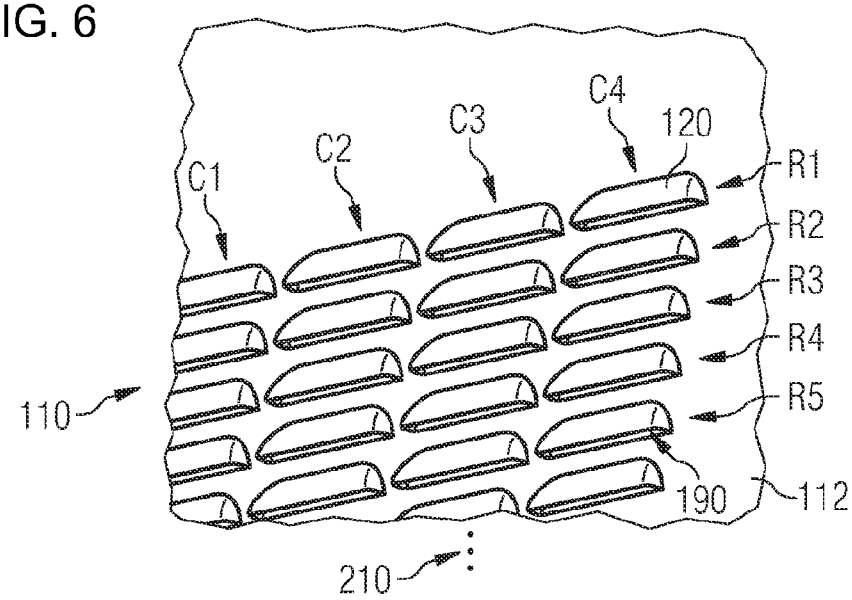
FIG. 6 illustrates a perspective view of the air inlet.

FIG. 5 shows an exploded view of air inlet 110 of the mechanical shelter. In the embodiment shown in FIGS. 5 and 6 there are five columns of apertures 190 or louvers in each panel 112 and 114. As shown in more detail in FIG. 6 there are four columns C1 to C4 at the outside panel 112. Rows R1 to R5 and further rows 210 extend in the horizontal direction, for instance 53 rows.

As mentioned above, inside panel 114 has the same shape as outside panel 112 in the region that forms air inlet 110.

However the region of inside panel 114 is turned top down compared to the corresponding region of outside panel 112. A frame 206 defines the distance D1 between outside panel 112 and inside panel 114.

In other embodiments, other shapes of apertures are used, for instance more circular shapes or more elliptical shapes. It is possible to use a matrix like arrangement of the apertures 190 or some other kinds of arrangement.

In other embodiments air outlet 100 is formed in the same way as air inlet 110, 110a or 110b. A filter element is optional for air outlet 100.

In other words, an air inlet mechanical structure of a telecommunication outdoor shelter is disclosed, especially an air inlet that fulfills IP55. Therefore the shelter forms an outdoor telecommunication shelter. The IP55 mechanical structure may include one double layer front door in which the air inlets are arranged, one membrane filter may be arranged in the door to prevent dust coming into the shelter.

To fulfill the cooling needs of the telecommunication shelter the air inlet forms an air channel for air flow. Sometimes this mechanical structure may be designed in a complex way.

There may be a lot of additional supplementary parts. Contrary, the invention simply uses the opposite holes in different sides of the double layer door plus the inside membrane filter to solve as much as possible problems.

The basic characterization for air inlets is that there are lots of appropriate hole-openings in the door panels. For IP55 needs, the holes in the outside of the door panels are always opened towards the bottom, to avoid water dropping in. These holes may have a height of about 5 mm (Millimeter), for instance. This height will not pass the test for the prevention of a 1 mm diameter wire from penetrating into the casing. However, to fulfill this test an additional part is included, namely inside panel 114. By arranging the opposite opening holes towards the top it will prevent the wire from entering. Combined with one membrane filter inside the door it is possible to pass the IP55 test, for instance.

Therefore there is a protection mechanical structure in a double layer door with cooling inlet openings in different sides of the door with different opening directions.

Although embodiments of the present invention and their advantages have been described in detail, it should be understood that various changes, substitutions and alterations can be made therein without departing from the spirit and scope of the invention as defined by the appended claim. For example, it will be readily understood by those skilled in the art that many of the features, functions, processes and methods described herein may be varied while remaining within the scope of the present invention. Moreover, the scope of the present application is not intended to be limited to the particular embodiments of the system, process, manufacture, method or steps described in the present invention. As one of ordinary skill in the art will readily appreciate from the disclosure of the invention systems, processes, manufacture, methods or steps presently existing or to be developed later that perform substantially the same function or achieve substantially the same result as the corresponding embodiments described herein may be utilized according to the present invention. Accordingly, the appended claims are intended to include within there scope such systems, processes, methods or steps.

LIST OF REFERENCE SIGNS 2, 4 side panels
6a, 6b back panel or panels
8 bottom panel
10 cabinet
11 casing
12 frame
14 door
16 top cover
20 front bottom rail
22 right bottom rail
24 back bottom rail
26 left bottom rail
30a, 30b left front rail
32a, 32b right front rail
34a, 34b right back rail
36a, 36b left back rail
40 front top rail
42 right top rail
44 back top rail
46 left top rail
50 support plate
52 rectifier
54 to 68 screw
70, 72 ventilation channel
76, 78 fan
80 slots for printed circuit boards
82 electronic devices
83 printed circuit board
84 channel
85 equipment
86 locking mechanism
88 telescope arm
90, 92 mounting rail
94 horizontal rail
96, 98 vertical rail
100 air outlet
110 air inlet
112 outside panel
114 inside panel
116 screw
118 filter
120 to 128 slat
130 to 138 slit
140 to 148 horizontal rib
150 bending edge
152 lower edge
160, 162 slat
170, 172 slit
A1, A2 angle
D1 to D5 distance
180, 182 horizontal rib
190, 192 aperture
194, 196, 198 arrow
C1 to C4 column
R1 to R5 row
204 wire
206 frame
210 further rows

The invention claimed is:
1. A casing for sheltering electronic components, the casing comprising:
an air inlet formed at a first position of the casing;
an air outlet formed at a second position of the casing;
said air inlet having a first plate with at least one first aperture and at least one first slat, said at least one first slat extending to an outside of the casing and downwardly from said first plate;

said air inlet further including a second plate disposed between said first plate and an interior of the casing, said second plate having at least one aperture formed therein and at least one second slat extending upwardly from said second plate towards the outside of the casing.

2. The casing according to claim 1, wherein said first plate is arranged substantially parallel to said second plate.

3. The casing according to claim 1, wherein:
said first slat and said first plate include a first acute angle pointing in a first direction; and
said second slat and said second plate include a second acute angle pointing in a second direction opposite the first direction.

4. The casing according to claim 1, wherein said first plate and said second plate comprise aluminum.

5. The casing according to claim 1, wherein said first plate and said second plate consist of aluminum or an aluminum alloy containing at least 90 atom percent aluminum.

6. The casing according to claim 1, further comprising a filter disposed between said second plate and the interior of the casing.

7. The casing according to claim 1, comprising a mechanical frame having a contour of a parallelepiped.

8. A network element, comprising:
a casing according to claim 1; and
electric or electronic components of a switch, a router, or a telecommunication device mounted in said casing.

9. An air passage assembly of a casing, the assembly comprising:
a first plate formed with at least one first aperture and having at least one first slat extends to an outside of the casing downwardly from said first plate; and
a second plate formed with at least one second aperture and having at least one second slat extending towards the outside of the casing and upwardly from said second plate.

10. The air passage assembly according to claim 9, configured with the features of the air inlet according to claim 1.

11. The air passage assembly according to claim 9, configured as an air outlet or an air inlet.

\* \* \* \* \*